(12) United States Patent
Nagoya (10) Patent No.: US 6,591,387 B1
(45) Date of Patent: Jul. 8, 2003

(54) COMMUNICATION EQUIPMENT WITH BOUNDARY SCAN ELEMENTS

(75) Inventor: Mitsugu Nagoya, Tokyo (JP)

(73) Assignee: Duaxes Corporation, Tokyo (JP)

( * ) Notice: Subject to any disclaimer, the term of this patent is extended or adjusted under 35 U.S.C. 154(b) by 0 days.

(21) Appl. No.: 09/424,452

(22) PCT Filed: May 28, 1998

(86) PCT No.: PCT/JP98/02356

§ 371 (c)(1),
(2), (4) Date: Nov. 23, 1999

(87) PCT Pub. No.: WO98/55925

PCT Pub. Date: Dec. 10, 1998

(30) Foreign Application Priority Data

Jun. 2, 1997 (JP) .............................. 9-143809

(51) Int. Cl.$^7$ ............................... G01R 31/28
(52) U.S. Cl. ....................................... 714/726
(58) Field of Search ................. 714/726, 729, 714/727

(56) References Cited

U.S. PATENT DOCUMENTS 5,450,415 A * 9/1995 Kamada ..................... 714/724
5,487,074 A * 1/1996 Sullivan ..................... 714/727
5,488,614 A * 1/1996 Shima ........................ 714/715
5,623,500 A   4/1997 Whetsel, Jr.

FOREIGN PATENT DOCUMENTS

| EP | 0 559 209 | 9/1993 |
| JP | 64-68843 | 3/1989 |
| JP | 2-268281 | 11/1990 |
| JP | 4-281691 | 10/1992 |
| JP | 6-300821 | 10/1994 |

* cited by examiner

Primary Examiner—Albert Decady
Assistant Examiner—Esaw Abraham
(74) Attorney, Agent, or Firm—Kanesaka & Takeuchi (57) ABSTRACT

A communication system includes a plurality of boundary scan elements including input and output terminals and a plurality of boundary cells individually assigned to the respective input terminals and output terminals, a plurality of data output units connected parallel to the boundary scan elements, and a communication controller connected to the boundary scan elements in series. The communication controller transmits and receives through the boundary scan elements control data for individually controlling the data output units. A signal data communication line is connected with the data output units in parallel, and a signal processing unit is connected with the signal data communication line and the communication controller for transmitting output data from the data output units under a control of the communication controller.

5 Claims, 8 Drawing Sheets

COMMUNICATION EQUIPMENT WITH BOUNDARY SCAN ELEMENTS

TECHNICAL FIELD

The present invention relates to a communication system for controlling terminal units through boundary scan elements, and particularly to a communication system which can quickly transmit output data from the terminal units.

BACKGROUND OF THE INVENTION

A boundary scan test method has been proposed as one of the inspection methods with a plurality of IC chips arranged over a printed wire board with printed wiring formed thereon, to see whether or not connection between each IC chip and each printed wiring is properly made and whether or not each printed wiring is not broken.

Figure 4:
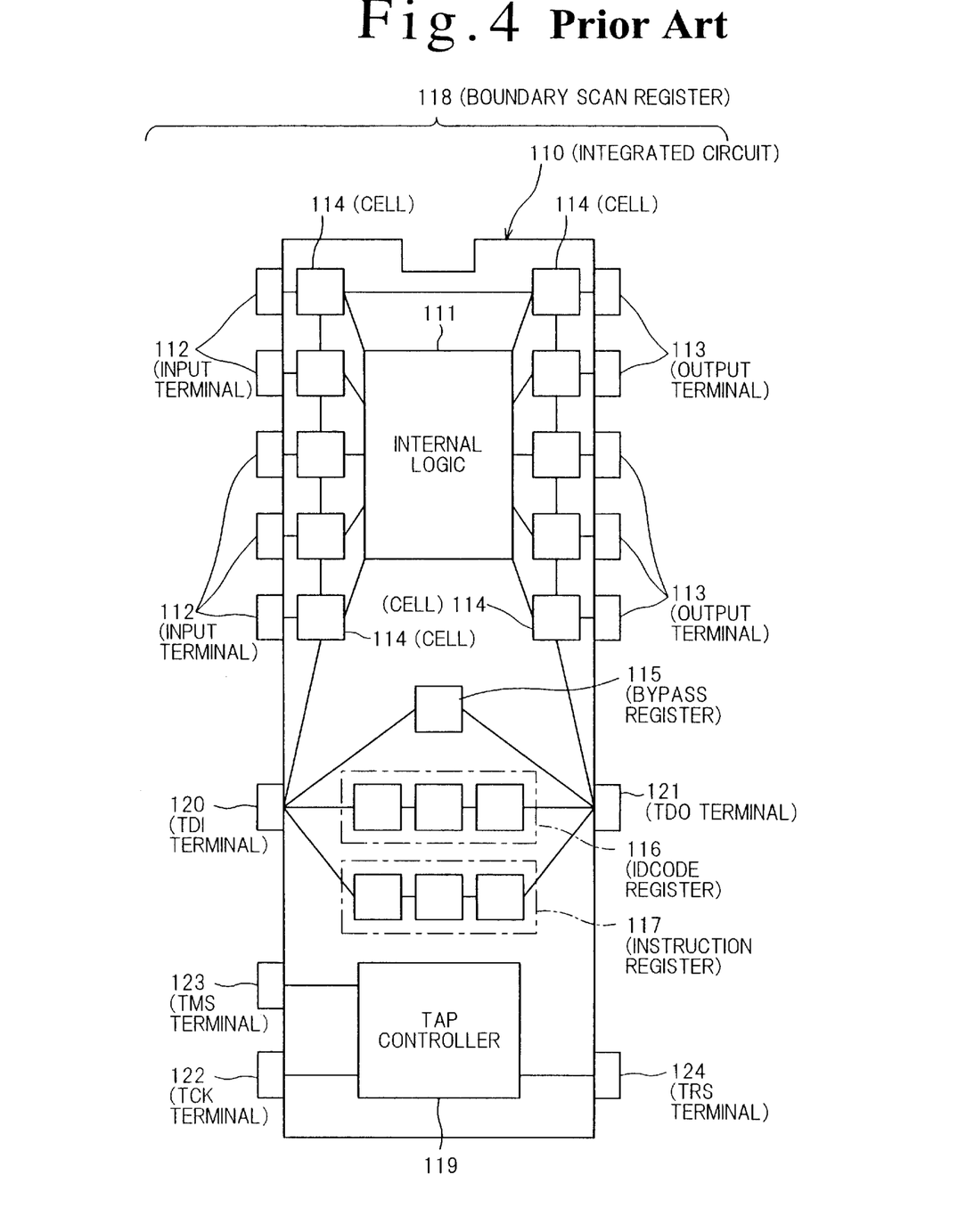
FIG. 4 is a block diagram of a conventional boundary scan element.

This boundary scan test method can be applied to integrated circuits (IC chips) into which boundary scan elements are incorporated. The boundary scan element, for example as shown in FIG. 4, includes a plurality of boundary cells 114 individually provided between input/output terminals of an internal logic 111 for implementing the inherent functions of the integrated circuit 110 and input/output terminals 112/113 of the integrated circuit 110, a TAP controller (TAP circuit) 119 for controlling input and output of data to or from the boundary cells 114, a TDI terminal 120 for receiving test data, a TDO terminal 121 for transmitting test data, a TCK terminal 122 into which a clock signal is input, and a TMS terminal 123 for receiving a mode signal for switching the operation mode of the TAP controller 119; and, if required, it is further provided with a bypass register 115, an ID CODE register 116, an instruction register 117, a TRS terminal 124 for receiving a reset signal, or the like. In this connection, the bypass register 115 to instruction register 117 is referred to as boundary scan register (118).

To describe the respective terminals or the signals to be input/output through the respective terminals in detail, TDI (Test Data In) is a signal for serial-inputting instructions and data to a test logic, and is sampled at rising edges of TCK. TDO (Test Data Out) is a signal for serial-outputting data from the test logic, the output value being changed at falling edges of TCK. TCK (Test Clock) supplies a clock to the test logic. It is a dedicated input for enabling the use of a serial test data path independent of the system clock inherent to the component. TMS (Test Mode Select) is a signal for controlling the test operation, and is sampled at rising edges of TCK. The TAP controller decodes this signal. TRST (Test Reset) is a negative logic symbol for a synchronously initializing the TAP controller, and is optional.

The integrated circuit 110 into which such boundary scan element is incorporated can be tested on the operating state thereof and the connecting relationship between this integrated circuit 110 and external devices, by the procedures described below.

First, in checking the quality of the internal logic 111 of the integrated circuit 110, serial data (test data) are input to the TDI terminal 120 of the integrated circuit 110 as they are shifted, and thereby the test data are set into the respective boundary cells 114 corresponding to the respective input terminals 112. In this state, the integrated circuit 110 is operated before the data set in the respective boundary cells 114 corresponding to the respective output terminals 113 are shifted for output from the TDO terminal 121, and, on the basis of the corresponding relationship between the serial data (test result data) thus obtained and the test data input to this integrated circuit 110, the internal logic 111 of the integrated circuit 110 is tested for its quality.

The boundary scan test method can also be carried out on a plurality of integrated circuits as long as the boundary scan elements are incorporated therein.

Figure 5:
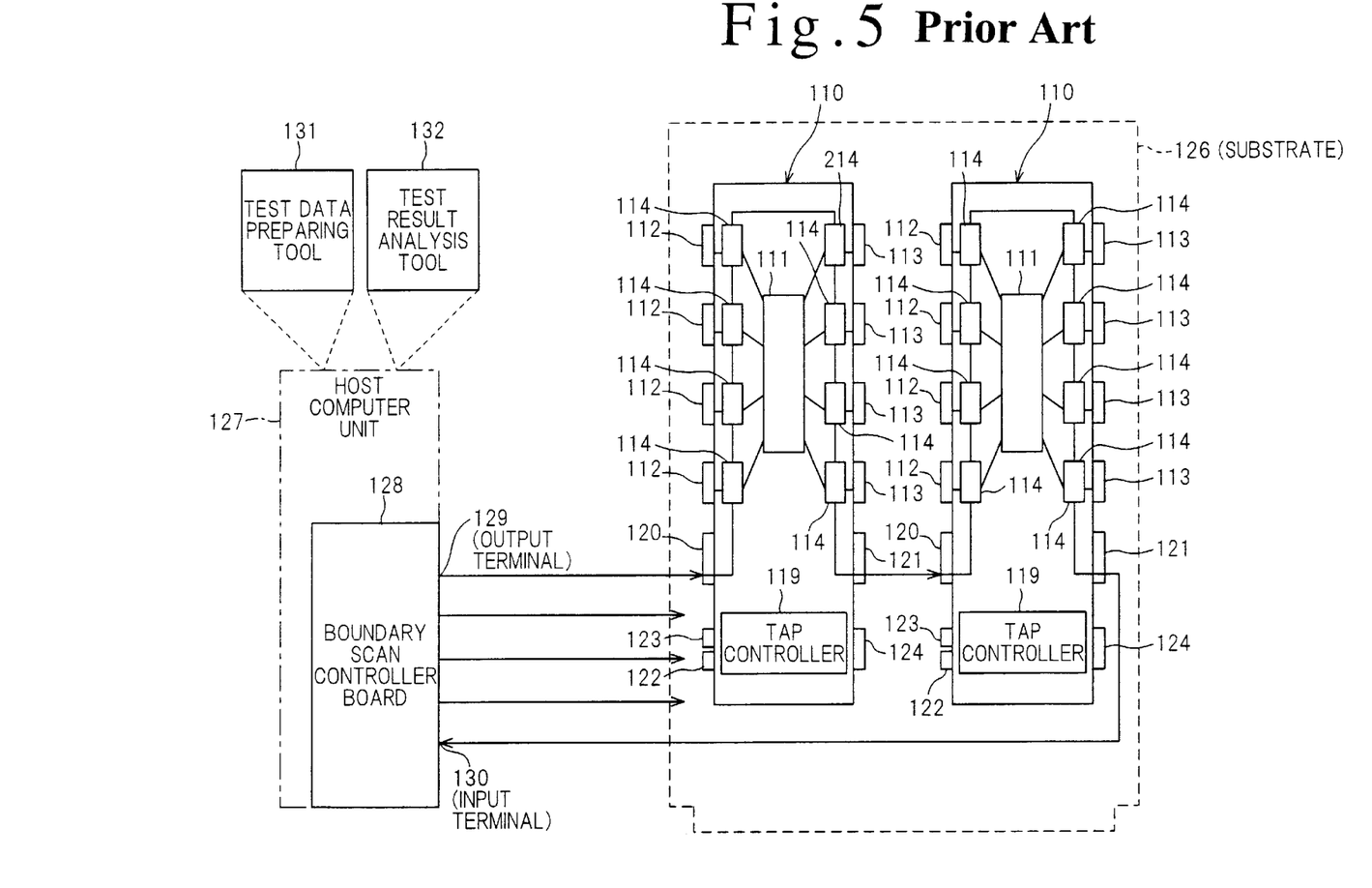
FIG. 5 is a block diagram showing an example of a boundary scan test using the boundary scan elements shown in FIG. 4.

For example, a plurality of integrated circuits 110 mounted on a substrate 126 as shown in FIG. 5 can also be subjected to a test for breakage and the like of the printed patterns between the integrated circuits 110, along with a test on the integrated circuits 110 themselves.

Figure 6:
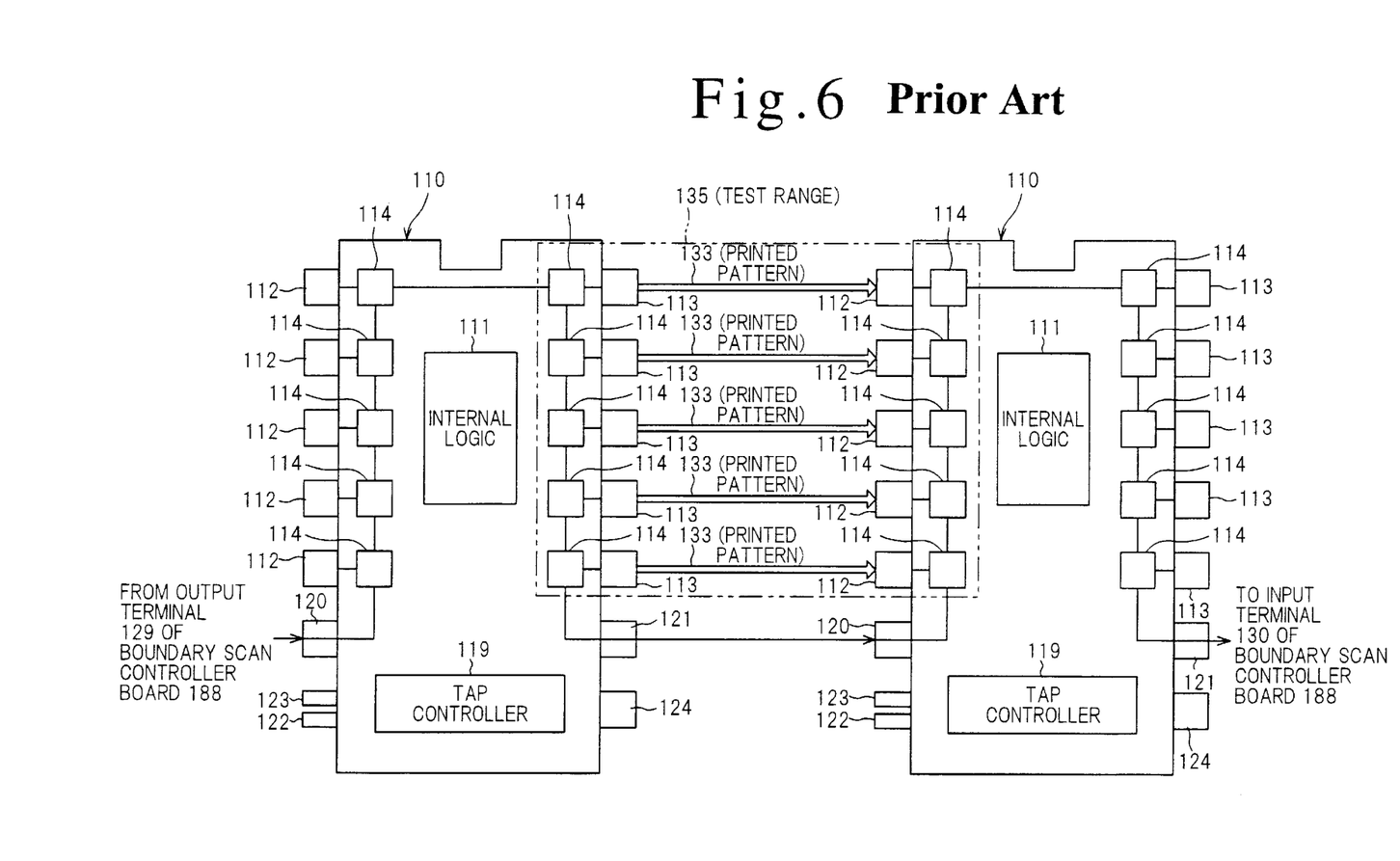
FIG. 6 is a schematic diagram showing an example of a boundary scan test using the boundary scan elements shown in FIG. 4.

In this case, the respective boundary scan elements incorporated in the plurality of integrated circuits 110 are connected in series with each other. Specifically, the TDO terminal 121 of the first integrated circuit 110 (the left in the drawing) and the TDI terminal 120 of the second integrated circuit 110 (the right in the drawing) are connected with each other, the output terminal 129 of a boundary scan controller board 128 provided in host computer unit 127 or the like and the TDI terminal 120 of the first integrated circuit 110 are connected with each other, and the input terminal 130 of the boundary scan controller board 128 and the TDO terminal 121 of the second integrated circuit 110 are connected with each other. The test procedures are as follows:

In testing breakage, short circuit, and the like of the printed patterns, a test data preparing tool 131 or the like is used to prepare test data (serial data), which is output from the output terminal 129 of the boundary scan controller board 128 and is input to the TDI terminal 120 of the first integrated circuit 110 while shifted, setting the test data into the respective boundary cells 114 corresponding to the respective output terminals 113 in this integrated circuit 110. In this state, the data stored in these respective boundary cells 114 are output from the respective output terminals 113 provided in the first integrated circuit 110 as shown in FIG. 6, and are input through the respective printed patterns 133 constituting a system bus and the like to the respective input terminals 112 of the second integrated circuit 110, and further fetched into the respective boundary cells 114 corresponding to these respective input terminals 112.

Thereafter, the data stored in the respective boundary cells 114 of these respective integrated circuits 110 are shifted and fetched through the input terminal 130 of the boundary scan controller board 128 as they are analyzed by using a test result analyzing tool 132 or the like, so that a test can be made for breakage, short circuit, and the like in such a test range 135 as the printed patterns 133 providing connection between the integrated circuits 110.

Figure 8:
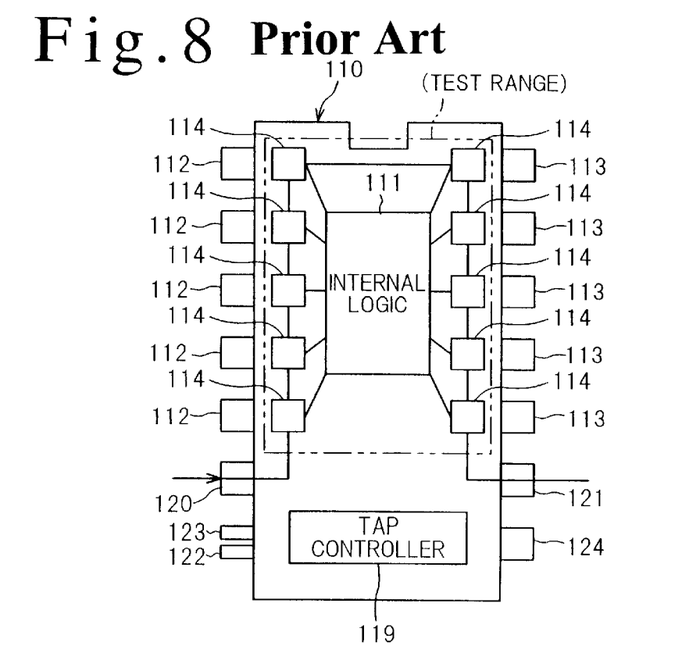
FIG. 8 is a schematic diagram showing an example of a boundary scan test using the boundary scan elements shown in FIG. 4.

Next, in inspecting the internal logic 111 of the respective integrated circuits 110, test data are output from the output terminal 129 of the boundary scan controller board 128, and are input to the TDI terminal 120 of the first integrated circuit 110 as they are shifted, so as to be set into the respective boundary cells 114 corresponding to the respective input terminals 112 of this integrated circuit 110 as shown in FIG. 8.

Subsequently, this integrated circuit 110 is operated, and the resulting data are fetched into the respective boundary cells 114 corresponding to the respective output terminals 113 before the data stored in these respective boundary cells 114 are shifted to be output from the TDO terminal 121 of the first integrated circuit 110. Here, the second integrated circuit 110 is brought into a bypass state as shown in FIG. 7 by the boundary scan controller board 128, so that the data output from the TDO terminal 121 are bypassed through the second integrated circuit 110 and fetched through the input terminal 130 of the boundary scan controller board 128.

Then, the test analyzing tool 132 or the like can be used for analysis of the fetched data to test whether or not the first integrated circuit 110 operates properly.

Figure 7:
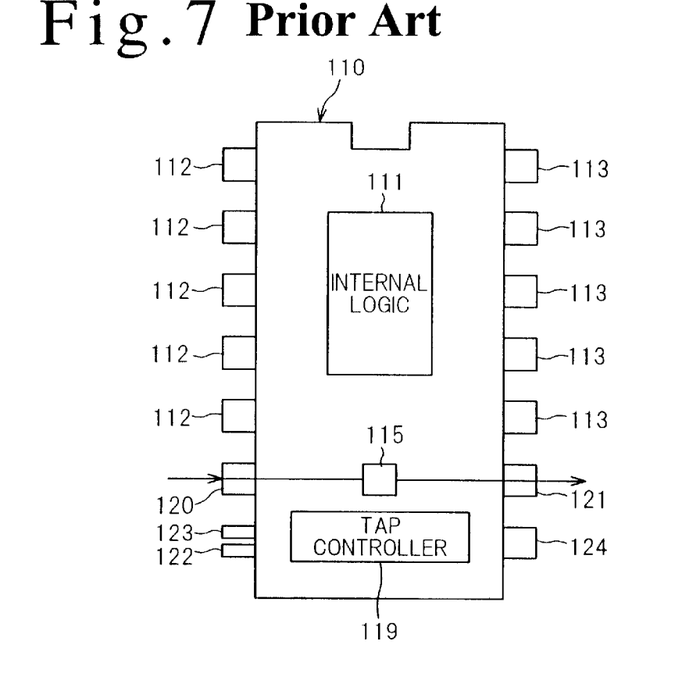
FIG. 7 is a schematic diagram showing an example of a boundary scan test using the boundary scan elements shown in FIG. 4.

Next, in the cases of inspecting the second integrated circuit 110, the boundary scan controller board 128 similarly brings the first integrated circuit 110 into a bypass state as shown in FIG. 7 before test data are output from the output terminal 129 of the boundary scan controller board 128 and bypassed through the first integrated circuit 110. Then, the test data are input to the TDI terminal 120 of the second integrated circuit 110 while shifted, to be set into the respective boundary cells 114 corresponding to the respective input terminals 112 of this integrated circuit 110 as shown in FIG. 8. Subsequently, this integrated circuit 110 is operated, and the resulting data are fetched into the respective boundary cells 114 corresponding to the respective output terminals 113. Thereafter, the data stored in the respective boundary cells 114 are shifted to be output from the TDO terminal 121, and further fetched through the input terminal 130 of the boundary scan controller board 128. Then, the fetched data can be analyzed by using the test result analyzing tool 132 and the like, so as to test whether or not the second integrated circuit 110 operates properly.

In this way, a substrate 126, as long as using integrated circuits 110 into which boundary scanning circuits are incorporated, can be tested for the quality of the respective integrated circuits 110 themselves and the connecting relationship between the integrated circuits 110 and the like by conducting the boundary scan test method.

Now, it was found by the present inventor that when integrated circuits into which such boundary scan elements are incorporated are used to constitute the substrate or the like of a sensor module, input and output of serial data can be made to or from the respective integrated circuits mounted on the substrate 126 at a rate on the order of 20 Mbps without the use of communication integrated circuits or the like.

Then, a communication system was proposed which applies the boundary scan elements to carry out communication with host computer units and the like without the use of communication devices.

Figure 9:
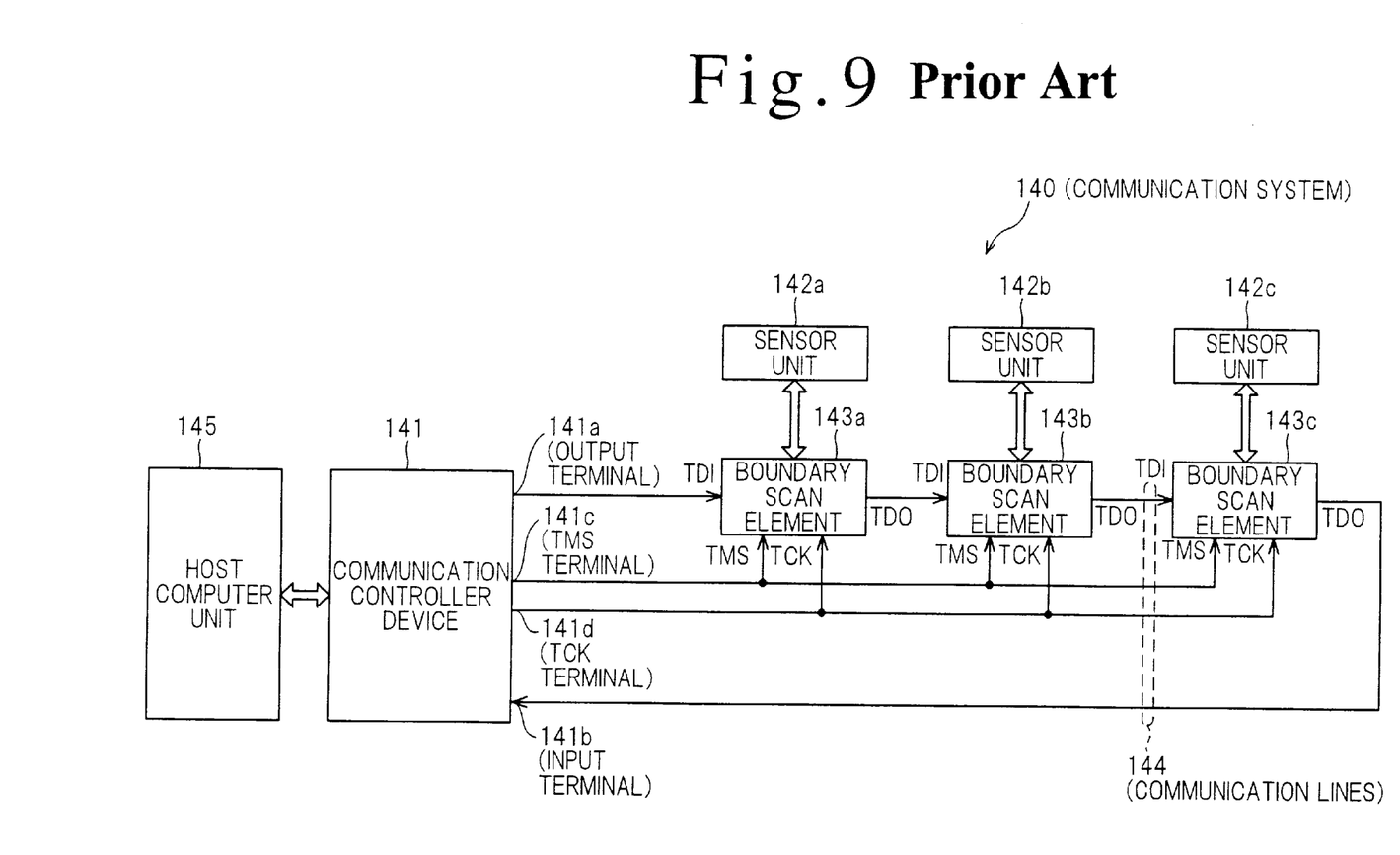
FIG. 9 is a block diagram showing an example of a conventional communication system to which boundary scan elements are applied.

FIG. 9 is a block diagram showing an example of the communication system to which the boundary scan elements are applied.

The communication system 140 shown in this figure includes: a communication controller device 141 for carrying out the transmitting of control data, the collection of detected data, and the like; a plurality of sensor units 142a–142c for carrying out the monitoring of an object to be monitored; a plurality of boundary scan elements 143a–143c provided for each of these sensor units 142a–142c, the boundary scan elements carrying out such processing as fetching the control data output from the aforesaid communication controller device 141 to supply the same to the respective sensor units 142a–142c, and fetching the detected data or the like output from these respective sensor units 142a–142c to supply the same to the aforesaid communication controller device 141; and communication lines 144 for providing connection between each of these boundary scan elements 143a–143c and the aforesaid communication controller device 141. The boundary scan elements are connected in series to the communication controller device 141. Specifically, the connection is made in such a manner that the output terminal 141a of the communication controller device 141 is connected to the TDI terminal of the boundary scan element 143a, the TDO terminal of the boundary scan element 143a connected to the TDI terminal of the next boundary scan element 143b, and so on, and the TDO terminal of the boundary scan element 143c is connected to the input terminal 141b of the communication controller device 141.

The function of this communication system 140 is as follows:

The respective boundary scan elements 143a–143c function in synchronization with the clock signal transmitted from the TCK terminal 141d of the communication controller device 141, and the operation mode of each TAP controller is switched by the TMS signal transmitted from the TMS terminal 141c of the communication controller device 141.

Now, in driving the respective sensor units 142a–142c according to the instruction from the host computer unit 145, control data (serial data) are output from the output terminal 141a of the communication controller device 141, and they are supplied to the respective boundary scan elements 143a–143c and set into the boundary cells corresponding to the output terminals. Then, the control data set are output from the output terminals, and supplied to the respective sensor units 142a–142c corresponding to the respective boundary scan elements 143a–143c, thereby driving these units.

Moreover, in the cases of collecting the detected data from the respective sensor units 142a–142c according to the instruction from the host computer unit 145, the detected data of the respective sensor units 142a–142c are once set in the respective boundary cells corresponding to the input terminals of the corresponding, respective boundary scan elements 143a–143c. Then, they are output as serial data from the TDO terminals, and fetched through the input terminal 141b of the communication controller device 141.

Such communication system 140, when setting control data into the respective boundary scan elements 143a–143c or when outputting the detected data from the respective boundary scan elements 143a–143c, can be maximized to 20 Mbps in data transfer rate, thereby allowing the transfer of communication data at higher rates than those of conventional communication systems.

However, the communication system described above had a problem in that when the detected data of the terminal units such as sensor units connected to the boundary scan elements are enormous, e.g. picture signals and the like, a drop in the transfer rate is undeniable and the effect of the high-rate data transfer obtained by the application of the boundary scan elements as communication elements is not exerted sufficiently.

Moreover, since the boundary scan elements can only input and output information in the form of digital signals, there was a problem in that they cannot fetch information in an analog signal form.

SUMMARY OF THE INVENTION

An object of the present invention is to provide a communication system which can transfer data from terminal units at higher rates.

Another object of the present invention is to provide a communication system which can transfer analog signals from terminal units at higher rates.

According to the present invention, there is provided a communication system comprising: a plurality of boundary scan elements including a plurality of boundary cells individually assigned to respective input terminals and output terminals, a TAP circuit for controlling input and output of data to or from the aforesaid boundary cells, a TDI terminal for inputting serial data to be supplied to the aforesaid boundary cells, a TDO terminal for outputting data from the aforesaid boundary cells in the form of serial data, a TCK terminal into which a clock signal is input, and a TMS terminal into which a mode signal for switching the operation mode of the aforesaid TAP circuit is input; a plurality of terminal units each connected with each of the aforesaid boundary scan elements or provided with an IC into which each of the elements is incorporated; and a communication controller connected with the aforesaid boundary scan elements in series for transmitting/receiving through the aforesaid boundary scan elements control data for individually controlling the aforesaid terminal units, wherein the aforesaid terminal units are connected in parallel and a single data communication line for transmitting output data of the aforesaid terminal units to the aforesaid communication controller is provided.

In the present invention, the communication controller controls the terminal units by transmitting control data thereto through the boundary scan elements. Then, data obtained by the terminal units are directly transmitted to the communication controller through the data communication line without the intermediary of the boundary scan elements.

This enables the high-rate transfer of data even when the output data of the terminal units are enormous, and allows the transfer of the output data even when they are analog signals.

Moreover, the output data are transmitted through a single data communication line, so that wiring of the system is simplified. In addition, the boundary scan elements are driven synchronously, so that when the respective terminal units are switched to transmit their output data through the data communication line, little time rag is produced between the output data and interference therebetween is avoided.

In the present invention, the terminal units include various sensor units, such as monitoring camera units, and the output data include the detected data of the sensor units, such as moving picture signals and still picture signals.

The control data include not only the data to be transmitted to the terminal units for the control of the terminal units, but also the status data and the like of the terminal units to be transmitted back from the terminal units.

The boundary scan elements include not only independent, separate packages but also those incorporated in other ICs. Besides, the input terminals and output terminals represent, in the case where each of the boundary scan elements is an independent package, the input terminals and output terminals thereof, and represent, in the case where the boundary scan elements are incorporated into other ICs, the input terminals and output terminals of the ICs. Then, the aforesaid output terminals and the aforesaid input terminals are connected to the input terminals and the output terminals of the terminal units, respectively, so that the data of the boundary cells are output to the terminal units and data are conversely input to the boundary cells.

Moreover, according to the present invention, the communication system described above may be provided in which: the output data are analog signals; and an analog signal processor for processing the output data may be provided between the communication controller and the communication liner. In this invention, the provision of the aforesaid analog signal processor can ease the load on the communication controller to quickly perform the processing of analog signals.

Furthermore, according to the present invention, there is provided the above-described communication system in which: the boundary cells include a plurality of input-terminal-side boundary cells connected in series and assigned to the respective input terminals individually, and a plurality of output-terminal-side boundary cells connected in series and assigned to the respective output terminals individually; and the input-terminal-side boundary cells and the aforesaid output-terminal-side boundary cells are connected in parallel between the TDI terminal and the TDO terminal.

In this invention, the boundary cells are not coupled all in series as conventionally, but are divided into the input-terminal-side boundary cells assigned to the input terminals and the output-terminal-side boundary cells assigned to the output terminals, which are connected in parallel between the TDI terminal and the TDO terminal. Accordingly, for example, when data from the TDI terminal are being set into the output-side boundary cells, direct transfer of the data to the output-side boundary cells can be made without the intermediary of the aforesaid input-terminal-side boundary cells, which can further realize the higher-rate transfer of data between the boundary scan elements and the communication controller or the terminal units.

BEST MODE FOR EMBODYING THE INVENTION

Configuration of First Embodiment

Figure 1:
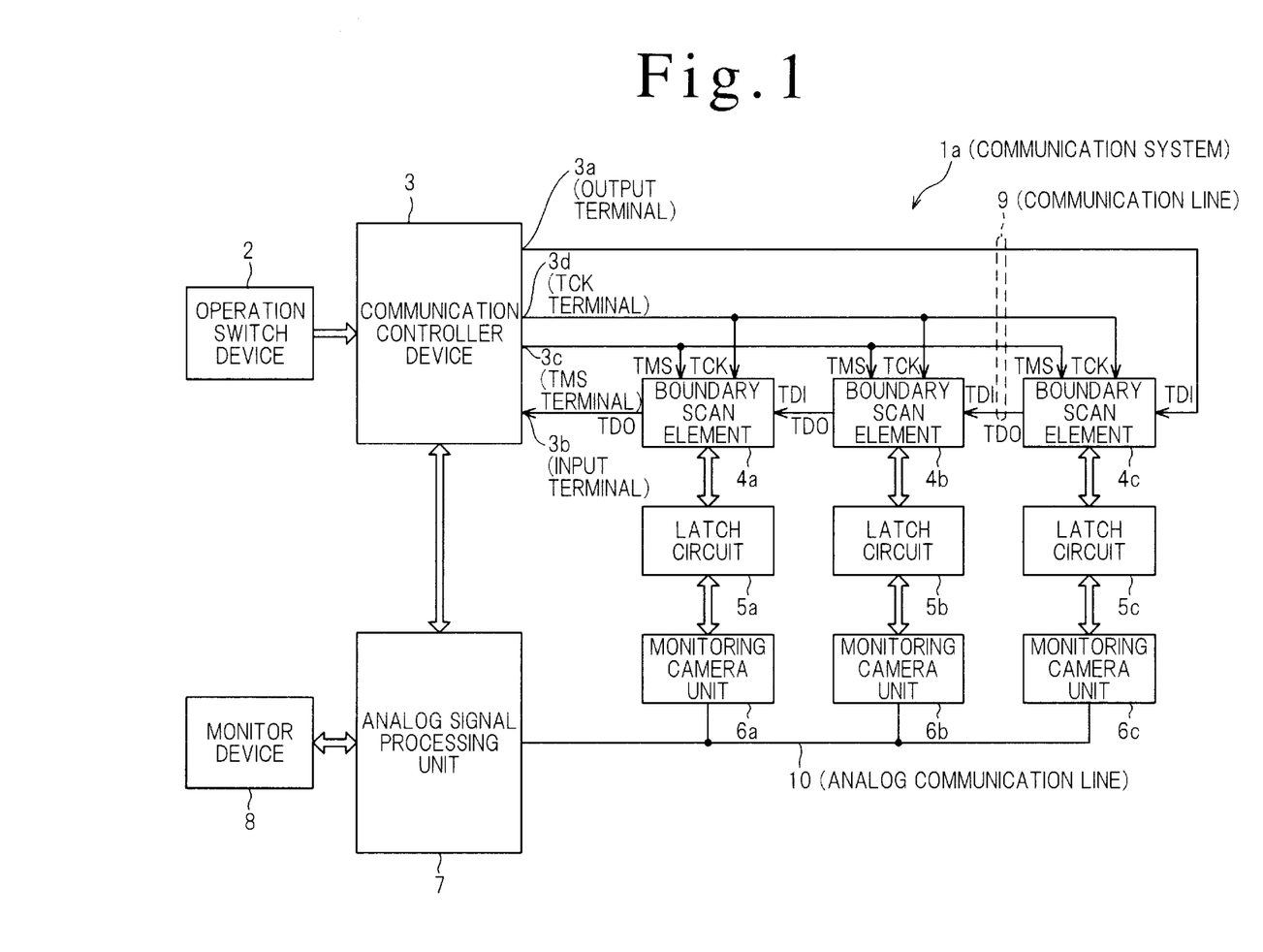
FIG. 1 is a block diagram showing a first embodiment of the communication system of the present invention.

FIG. 1 is a block diagram showing a first embodiment of the communication system of the present invention.

The communication system 1a shown in this figure includes a plurality of boundary scan elements 4a–4c, monitoring camera units (terminal units) 6a–6c connected with the respective boundary scan elements 4a–4c through latch circuits 5a–5c, a communication controller device 3 for controlling the monitoring camera units 6a–6c through the boundary scan elements 4a–4c, a single analog communication line (data communication line) 10 through which picture signals of the monitoring camera units 6a–6c are transmitted, and an analog signal processing unit 7 for receiving the picture signals transmitted from the analog communication line 10; furthermore, to the communication controller device 3 is connected an operation switch device 2, and to the analog signal processing unit 7 is connected a monitor device 8 for displaying the picture signals output from the monitoring camera units 6a–6c.

The boundary scan elements 4a–4c have the same configuration as that shown in FIG. 4, and are connected in series to the communication controller device 3. Specifically, the output terminal 3a of the communication controller device 3 is connected to the TDI terminal of the boundary scan element 4c, the TDO terminal of the boundary scan element 4c is connected to the TDI terminal of the next boundary scan element 4b, and the TDO terminal of the boundary scan element 4b is similarly connected to the TDI terminal of the boundary scan element 4a. Finally, the TDO terminal of the boundary scan element 4a is connected to the input terminal 3b of the communication controller device 3. Accordingly, the data being supplied to the boundary scan elements 4a–4c or the data being output from the boundary scan elements 4a–4c are always transferred in the direction from the boundary scan elements 4c to 4a.

Further, the TCK terminal and the TMS terminal of each of the boundary scan elements 4a–4c are supplied with a clock signal and a mode signal from the communication controller device 3, respectively, and thereby the respective boundary scan elements 4a–4c function synchronously.

The input terminals and output terminals (not shown) of the boundary scan elements 4a–4c are connected with the corresponding latch circuits 5a–5c, respectively. Control data set in the boundary cells are output through the respective latch circuits 5a–5c to the corresponding monitoring camera units 6a–6c, and the status data of the monitoring camera units 6a–6c, such as data indicating whether the monitoring operation is in action or not, data indicating the direction of monitoring, and data indicating the magnitude of the shooting lens, are input through the latch circuits 5a–5c to the boundary cells.

The monitoring camera units 6a–6c are arranged at positions corresponding to objects to be monitored, carry out the shooting of the objects to be monitored while switching the shooting directions and the magnitude of the shooting lens in accordance with the control data output from the corresponding latch circuits 5a–5c, and transmit back to the corresponding latch circuits 5a–5c the shooting conditions and the like as the status data. In addition, the monitoring camera units 6a–6c directly transmit the picture signals obtained by the shooting to the analog communication line 10 without the intermediary of the latch circuits 5a–5c.

The communication controller device 3 includes hardware circuits, microprocessor circuits, and the like, and transmits control data to the respective boundary scan elements 4a–4c in accordance with selection indication data output from the operation switch device 2, thereby controlling the monitoring camera units 6a–6c. It also receives the status data from each of the boundary scan elements 4a–4c, and analyzes the same to check whether or not the monitoring camera units 6a–6c are functioning normally, and the like. Moreover, it controls the analog signal processing unit 7 in accordance with the selection indication data output from the operation switch device 2, so that the picture signals transmitted from the analog communication line 10 are displayed on the monitor device 8.

The analog communication line 10 is composed of a coaxial cable and the like, and connects between the analog signal input terminal of the analog signal processing unit 7 and the analog signal output terminals of the respective monitoring camera units 6a–6c in parallel. And, it fetches a picture signal output from any one of the monitoring camera units 6a–6c, and transmits the same to the analog signal input terminal of the analog signal processing unit 7.

The analog signal processing unit 7 includes an analog signal input circuit for fetching a picture signal, an analog signal processing circuit for applying designated image processing to the picture signal fetched by this analog signal input circuit, a picture signal output circuit for outputting the picture signal image processed by this analog signal processing circuit in the form of an analog signal or in the form of a digital signal, and a control circuit for controlling these circuits in accordance with operation indication signals from the communication controller device 3, and the like.

In accordance with instructions output from the communication controller device 3, this analog signal processing unit 7 fetches a picture signal supplied through the analog communication line 10, and superimposes thereon a status determination result and the like of the respective monitoring camera units 6a–6c supplied from the communication controller unit 3 before supplying the same to the monitor device 8 in a designated signal form among the analog signal form or the digital signal form.

The operation switch device 2 has a plurality of push button switches and the like, generates selection indication data and the like for selecting the monitoring camera units 6a–6c and the like in accordance with the operation content of the respective push button switches, and supplies the same to the aforesaid communication controller device 3. A user can operate this operation switch device 2 to make the communication system 1a execute particular processing.

The monitor device 8 is constituted by a CRT unit, liquid crystal display unit, or the like having a display capacity required to display pictures of the objects to be monitored, and fetches the picture signal in the analog signal form or picture signal in the digital signal form output from the analog signal processing unit 7 to displays the picture expressed by this picture signal.

Operation of First Embodiment

Next, referring to the block diagram shown in FIG. 1, the operation of the communication system 1a will be described in detail. The communication system 1a can be manually switched to display the picture and the like of any monitoring camera unit 6a–6c desired, and can be automatically switched to display the picture and the like of the respective monitoring camera units 6a–6c in rotation.

Manual Switching Operation of Monitoring Camera Units 6a–6c

When manual selection indication data are transmitted from the operation switch device 2 to the communication controller device 3, the communication controller device 3 prepares control data required to turn on one of the monitoring camera units 6a–6c designated by the manual selection indication data and to turn off the other monitoring camera units 6a–6c. These control data are then transmitted through the communication lines 9 and set into the boundary cells on the output sides of the respective boundary scan elements 4a–4c.

At the same time, from the communication control device 3 to the analog signal processing unit 7 is output an operation indication signal indicating a fetch instruction for a picture signal, which makes the analog signal processing unit 7 ready for the fetching operation of picture signals.

Next, when a mode signal indicating an output instruction for control data is output from the TMS terminal 3c of the communication controller device 3, the control data set in the boundary cells on the output sides of the respective boundary scan elements 4a–4c are output to the corresponding latch circuits 5a–5c, and further transmitted to the respective monitoring camera units 6a–6c. According to the content of the control data received, each of the monitoring camera units 6a–6c recognizes whether signal output permission is issued or not, and only one of the monitoring camera units, e.g. the monitoring camera unit 6c, transmits its picture signal onto the analog communication line 10. The picture signal transmitted is fetched into the analog signal processing unit 7, and, further, a picture according to that picture signal is displayed on the monitor device 8.

Subsequently, unless the operation switch device 2 is operated, the monitoring camera units 6a–6c hold their states; and when the remaining monitoring camera unit 6a or 6b is selected, manual selection indication data are newly prepared, and the picture of either monitoring camera unit 6a–6c selected is displayed on the monitor 8 through the procedures described above.

Automatic Switching Operation of Monitoring Camera Units 6a–6c

When automatic selection indication data are transmitted from the operation switch device 2 to the communication controller device 3, the communication controller device 3 prepares control data required to turn on one of the monitoring camera units 6a–6c and to turn off the other monitoring camera units 6a–6c. This is followed by the same processing as that in the initiative switching operation described above, so that the picture of the monitoring camera unit selected, e.g. 6a, is displayed on the monitor 8.

Then, after elapse of a certain time set in advance, the communication controller device 3 prepares control data required to turn on the monitoring camera unit 6b which follows the monitoring camera unit 6a selected initially and to turn off the remaining monitoring camera units 6a and 6c. These control data are transmitted through the communication lines 9, and the picture of the monitoring camera unit 6b is displayed on the monitor 8 through the same processing as that in the case described above.

Thereafter, the selecting operations for the respective monitoring camera units 6a–6c described above are cyclically repeated at each elapse of the certain time set in advance, so that the pictures obtained by the respective monitoring camera units 6a–6c are sequentially displayed on the monitor device 8.

Status Detecting Operation of Monitoring Camera Units 6a–6c

Here, in parallel to the manually-/automatically-switched picture fetching operation or the image display operation of the respective monitoring camera units 6a–6c described above, status data indicating the operation status and the like are output from the respective monitoring camera units 6a–6c. These status data are latched by the corresponding latch circuits 5a–5c before transmitted to the input terminals of the respective boundary scan elements 4a–4c and set into the boundary cells.

Subsequently, when a TMS signal indicating a read instruction is output from the TMS terminal 3c of the communication controller device 3, the status data set in the boundary cells are serially transferred from the TDO terminals and supplied to the input terminal 3b of the communication controller device 3.

The communication controller device 3 analyzes the status data received, and makes judgements as to the shooting conditions of the respective monitoring camera units 6a–6c, whether or not the respective monitoring camera units 6a–6c are functioning normally, whether or not the communication lines 9 or the like are not broken, or the like. These respective detection results and respective judgement results can also be displayed on the monitor device 8 through the analog signal processing unit 7.

Effect of First Embodiment

As has been described above, in the first embodiment of the present invention, the picture signals transmitted from the monitoring camera units 6a–6c are directly transmitted to the analog signal processing unit 7 through the analog communication line 10 without the intermediary of the boundary scan elements 4a–4c. This allows the high-rate transfer and processing of picture signals without impairing the effect of the high-rate data transfer due to the use of the boundary scan elements 4a–4c. Moreover, the picture signals of the plurality of monitoring camera units 6a–6c can be transmitted by a single analog communication line 10, with the result of simple wiring; besides, the synchronous functioning of the boundary scan elements 4a–4c avoids the time rags and interference to the picture signals in switching the monitoring camera units 6a–6c.

Configuration of Second Embodiment

Figure 2:
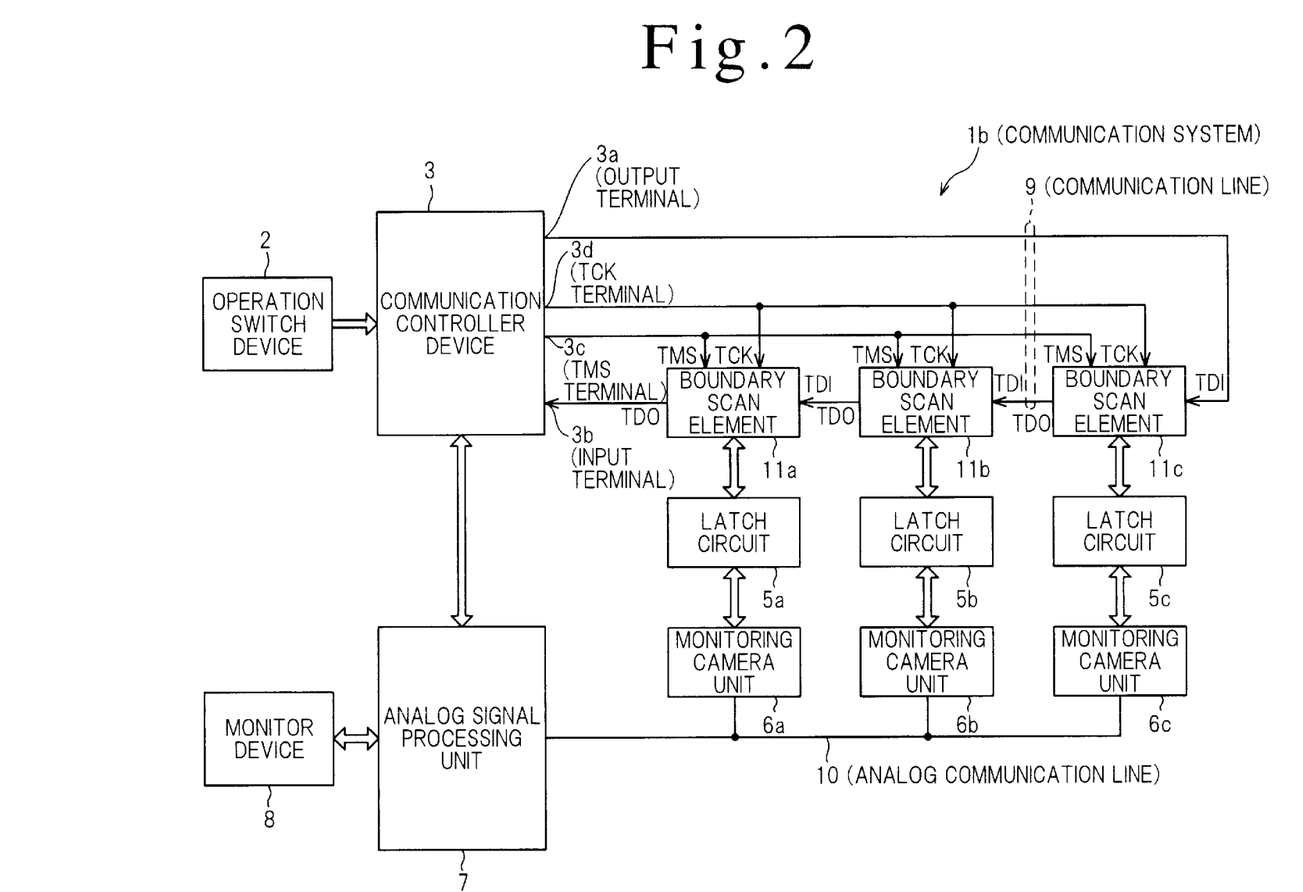
FIG. 2 is a block diagram showing a second embodiment of the communication system of the present invention.

FIG. 2 is a block diagram showing a second embodiment of the communication system according to the present invention.

The difference between the communication system 1b shown in this figure and the communication system 1a shown in FIG. 1 consists in that specially-designed boundary scan elements 11a–11c are used in place of the boundary scan elements having the constitution shown in FIG. 4; this causes the speed-up of the transfer of control data and the like. Other configurations and functions are the same as those of the communication system 1a; and to the same parts are assigned the same numerals in FIG. 2. Hereinafter, concrete description will be made on the boundary scan elements 11a–11c.

Figure 3:
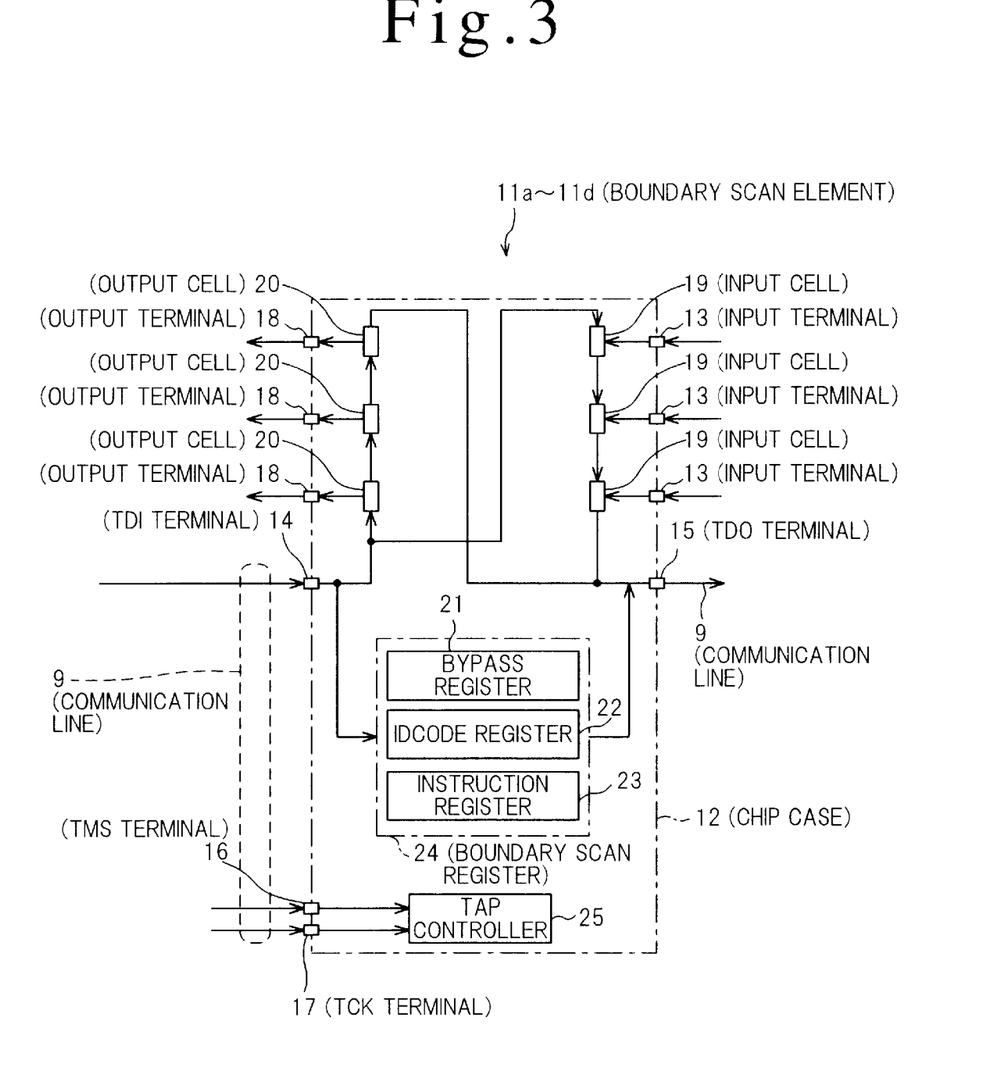
FIG. 3 is a block diagram of the boundary scan element 11a–11c in FIG. 2.

As shown in FIG. 3, each of the boundary scan elements 11a–11c is incorporated into a chip case 12 as a single package, and includes, similarly to the boundary scan element shown in FIG. 4, boundary cells 19 and 20, a TAP controller 25 for controlling input and output of data to or from the boundary cells 19 and 20, a TDI terminal 14 for receiving serial data, a TDO terminal 15 for transmitting serial data, a TCK terminal 17 into which a clock signal is input, and a TMS terminal 16 for receiving a mode signal for switching the operation mode of the TAP controller 25; and, if required, it is further provided with a bypass register 21, an ID CODE register 22, an instruction register 23, and the like (boundary scan resister 24).

In the boundary scan elements 11a–11c of FIG. 3, however, the boundary cells 19 and 20 are not connected all in series, and are divided into output cells (output-side boundary cells) 20 and input cells (input-side boundary cells) 19 corresponding to the output terminals 18 and input terminals 13 arranged on the exterior of the chip case 12, respectively. The input cells 19 and the output cells 20 are individually connected in series, and are connected in parallel between the TDI terminal 14 and the TDO terminal 15.

Then, as a special operation, the boundary scan elements 11a–11c have a mode in which either the input cells 19 or the output cells 20 alone are brought into their operative states and the other are brought into their non-operative states.

Thereby, when the respective input cells 19 are put in their operative states, the status data and the like fetched into the respective input cells 19 through the respective input terminals 13 can be directly output from the TDO terminal 15 without being shifted through the output cells 20 as conventionally.

Moreover, when the respective output cells 20 are in their operative states, the control data and the like input to the TDI terminal 14 can be shifted and set directly into the respective output cells 20, and output from the respective output terminals 18 to the external, without being shifted through the input cells 19 as conventionally.

By the use of the operation mode inherent in the boundary scan elements 11a–11c described above, the communication system 1b composed of such boundary scan elements 11a–11c is further improved in the data transfer rate between the communication controller device 3 and the respective boundary scan elements 11a–11c as compared with the communication system 1a described above.

Other Embodiments

Further, while in the first and second embodiments described above, the picture signals in the analog signal form are output from the respective monitoring camera units 6a–6c and they are input through the analog communication line 10 to the analog signal processing unit 7, picture signals in the digital signal form may be output from the respective monitoring camera units 6a–6c and they may be input through a digital communication line (or a bus, an optical fiber cable, or the like) to a digital signal processing unit.

In addition, while in the first and second embodiments described above, the monitoring camera units 6a–6c are controlled as the terminal units of the communication systems 1a and 1b, other terminal units e.g. a measuring device for measuring physical values of the objects to be monitored, individual computer unit in distributional arrangement, and the like may be controlled to collect measurement, processing results, and the like output from these respective measuring devices and respective computer unit.

What is claimed is:

1. A communication system comprising:
   a plurality of boundary scan elements including input and output terminals, a plurality of boundary cells individually assigned to the respective input terminals and output terminals, a TAP circuit for controlling input and output of data to or from said boundary cells, a TDI terminal for inputting serial data to be supplied to said boundary cells, a TDO terminal for outputting data from said boundary cells in a form of serial data, a TCK terminal into which a clock signal is input, and a TMS terminal into which a mode signal for switching the operation mode of said TAP circuit is input;
   a plurality of data output units, each being connected in parallel with each of said boundary scan elements or provided with an IC into which each of the elements is incorporated;
   a communication controller connected with said boundary scan elements in series, said communication controller transmitting/receiving through said boundary scan elements control data for individually controlling said data output units;
   a signal data communication line connected with said data output units in parallel; and
   a signal processing unit connected with said signal data communication line and said communication controller for transmitting output data from said data output units under a control of said communication controller.

2. The communication system according to claim 1, wherein said output data are analog signals; and said signal processor unit processes said analog signals.

3. The communication system according to claim 1, wherein said boundary cells include a plurality of input-terminal-side boundary cells connected in series and assigned to said input terminals individually, and a plurality of output-terminal-side boundary cells connected in series and assigned to said output terminals individually, and said input-terminal-side boundary cells and said output-terminal-side boundary cells are connected in parallel between said TDI terminal and said TDO terminal.

4. The communication system according to claim 1, wherein said data output units include monitoring cameras, measuring devices for measuring physical values of objects, and computer units arranged separately.

5. The communication system according to claim 4, further comprising latch circuits, each being situated between each of the data output unit and each of the boundary scan elements.

* * * * *